United States Patent
Kijima et al.

(10) Patent No.: US 10,115,888 B2
(45) Date of Patent: Oct. 30, 2018

(54) METHOD FOR MANUFACTURING CRYSTAL FILM

(71) Applicant: YOUTEC CO., LTD., Chiba (JP)

(72) Inventors: Takeshi Kijima, Chiba (JP); Yuuji Honda, Chiba (JP)

(73) Assignee: Advanced Material Technologies, Inc., Chiba (JP)

( * ) Notice: Subject to any disclaimer, the term of this patent is extended or adjusted under 35 U.S.C. 154(b) by 0 days.

(21) Appl. No.: 15/444,879

(22) Filed: Feb. 28, 2017

(65) Prior Publication Data
US 2017/0170384 A1   Jun. 15, 2017

Related U.S. Application Data

(63) Continuation of application No. 14/335,121, filed on Jul. 18, 2014, now abandoned.

(30) Foreign Application Priority Data

Jul. 25, 2013   (JP) ................. 2013-154870

(51) Int. Cl.
  *C23C 16/40*   (2006.01)
  *C23C 16/06*   (2006.01)
  (Continued)

(52) U.S. Cl.
  CPC .......... *H01L 41/316* (2013.01); *C23C 14/185* (2013.01); *C23C 14/30* (2013.01);
  (Continued)

(58) Field of Classification Search
  CPC ..... C23C 16/40; C23C 16/405; C23C 16/409; C23C 16/06; C23C 16/14
  See application file for complete search history.

(56) References Cited

U.S. PATENT DOCUMENTS 5,030,613 A   7/1991   Chai
5,122,509 A *  6/1992   Beetz, Jr. ............ H01L 39/2461
                                                          428/408
(Continued)

FOREIGN PATENT DOCUMENTS

JP   8-109099   4/1996
JP   2001-152321   6/2001
(Continued)

OTHER PUBLICATIONS

Nicholls, Rebecca, et al., "Crystal Structure of the ZrO Phase at Zirconium/Zirconium Oxide Interfaces". Advanced Engineering Materials, 2015, 17, No. 2, pp. 211-215.*

(Continued)

*Primary Examiner* — Bret P Chen
(74) *Attorney, Agent, or Firm* — Wenderoth, Lind & Ponack, L.L.P.

(57) ABSTRACT

A method for manufacturing a crystal film including: forming a Zr film on a substrate heated to 700° C. or more by a vapor deposition method using a vapor deposition material having a Zr single crystal; forming a $ZrO_2$ film on said Zr film on a substrate heated to 700° C. or more, by a vapor deposition method using said vapor deposition material having a Zr single crystal, and oxygen; and forming a $Y_2O_3$ film on said $ZrO_2$ film on a substrate heated to 700° C. or more, by a vapor deposition method using a vapor deposition material having Y, and oxygen.

8 Claims, 4 Drawing Sheets

(51) Int. Cl.
*H01L 41/316* (2013.01)
*C30B 29/68* (2006.01)
*C30B 29/02* (2006.01)
*C30B 29/16* (2006.01)
*H01L 41/08* (2006.01)
*H01L 41/319* (2013.01)
*C30B 23/02* (2006.01)
*C23C 14/18* (2006.01)
*C23C 14/30* (2006.01)
*C23C 14/34* (2006.01)
*C23C 16/48* (2006.01)
*C30B 5/00* (2006.01)
*C30B 23/08* (2006.01)
*C30B 25/10* (2006.01)
*C30B 25/18* (2006.01)
*C30B 29/06* (2006.01)
*C30B 29/32* (2006.01)

(52) U.S. Cl.
CPC ............ *C23C 14/34* (2013.01); *C23C 16/405* (2013.01); *C23C 16/487* (2013.01); *C30B 5/00* (2013.01); *C30B 23/02* (2013.01); *C30B 23/08* (2013.01); *C30B 25/10* (2013.01); *C30B 25/18* (2013.01); *C30B 29/02* (2013.01); *C30B 29/06* (2013.01); *C30B 29/16* (2013.01); *C30B 29/32* (2013.01); *C30B 29/68* (2013.01); *H01L 41/0815* (2013.01); *H01L 41/319* (2013.01); *Y10T 428/266* (2015.01)

(56) References Cited

U.S. PATENT DOCUMENTS

| | | | | |
|---|---|---|---|---|
| 5,372,089 A | * | 12/1994 | Yoshida | .................. C30B 23/02 117/98 |
| 5,472,565 A | * | 12/1995 | Mundt | ............. H01J 37/32009 156/345.34 |
| 5,858,558 A | * | 1/1999 | Zhao | ..................... C22C 19/052 148/404 |
| 2002/0006733 A1 | | 1/2002 | Noguchi | |
| 2002/0015852 A1 | * | 2/2002 | Noguchi | ................ C30B 23/02 428/469 |
| 2002/0076875 A1 | * | 6/2002 | Wasa | ...................... B41J 2/161 438/207 |
| 2009/0021119 A1 | | 1/2009 | Yasumi | |
| 2011/0262233 A1 | * | 10/2011 | Martensson | ........ C23C 16/0272 407/119 |
| 2015/0147587 A1 | | 5/2015 | Kijima | |

FOREIGN PATENT DOCUMENTS

| | | |
|---|---|---|
| JP | 3623001 | 2/2005 |
| JP | 2006-73964 | 3/2006 |
| JP | 2006-108290 | 4/2006 |
| WO | 2008/075641 | 6/2008 |

OTHER PUBLICATIONS

Copel, M., et al., "Structure and stability of ultrahin zirconium oxide layers on Si(001)". Applied Physics Letters, vol. 76, No. 4, Jan. 24, 2000, pp. 436-438.*

* cited by examiner

METHOD FOR MANUFACTURING CRYSTAL FILM

BACKGROUND OF THE INVENTION

Field of the Invention

The present invention relates to a crystal film, a method for manufacturing a crystal film, a vapor deposition apparatus and a multi-chamber apparatus.

Description of a Related Art

When producing a Pb (Zr, Ti) $O_3$ (hereinafter, referred to as "PZT") film having a perovskite structure, as a foundation film thereof, the use of a crystal film oriented in (100), with high single crystallinity is favorable. As the crystal film, for example, the use of a YSZ film is considered. A method for producing the YSZ film will be explained below.

A YSZ film was formed by a laser ablation method in which materials scattered from targets by irradiating targets of polycrystalline Y and Zr with light from a KrF excimer laser (wavelength of 248 nm) are vapor-deposited on a substrate. As the result of examining each of the YSZ films formed on the substrate by an X-ray pole figure method, the distribution (half-value width) of the orientation of the (100) axis in a plane parallel to the substrate was 7° (for example, see Patent Literature 1).

In order to more enhance piezoelectric characteristics of a PZT film, further enhancement of the single crystallinity of the YSZ film is required. This is because, when a PZT film having higher piezoelectric characteristics is used as, for example, an actuator, the moving width becomes larger and the performance of the actuator is improved.

[Patent Literature 1] Japanese Patent No. 3623001 (Example 1)

SUMMARY OF THE INVENTION

An object of an aspect of the present invention is to enhance single crystallinity of a stacked film in which a $ZrO_2$ film and a $Y_2O_3$ film are stacked, or a YSZ film.

Furthermore, an object of an aspect of the present invention is to provide a vapor deposition apparatus or a multi-chamber apparatus capable of manufacturing a stacked film in which a $ZrO_2$ film and a $Y_2O_3$ film are stacked, or a YSZ film, both having improved single crystallinity.

Hereinafter, various aspects of the present invention will be explained.

[1] A crystal film including:
a Zr film; and
a stacked film in which a $ZrO_2$ film and a $Y_2O_3$ film are stacked or a YSZ film, formed on the Zr film,
wherein a peak half-value width when the stacked film or the YSZ film is evaluated by X-ray diffraction is 0.05° to 2.0° (preferably 0.05° to 0.5°).

[2] The crystal film according to the above [1], wherein thickness of the Zr film is 0.2 nm to 30 nm (preferably 0.2 nm to 5 nm).

[3] The crystal film according to the above [1] or [2], wherein said stacked film or said YSZ film is an oriented film oriented in (100).

[4] The crystal film according to any one of the above [1] to [3], wherein said crystal film is formed on a substrate having a (100) crystal plane.

[5] The crystal film according to any one of the above [1] to [4], wherein:
on the stacked film or the YSZ film, a Pt film oriented in (100) is formed; and
a peak half-value width when the Pt film is evaluated by X-ray diffraction is from 0.05° to 2.0° (preferably 0.05° to 0.5°).

[6] The crystal film according to the above [5], wherein:
a dielectric film is formed on the Pt film; and
the dielectric film is represented by a general formula $ABO_3$, being a film containing a perovskite material, A including at least one element selected from the group consisting of Al, Y, Na, K, Rb, Cs, La, Sr, Cr, Ag, Ca, Pr, Nd, Bi and an element of the lanthanum series in the periodic table, B including at least one element selected from the group consisting of Al, Ga, In, Nb, Sn, Ti, Ru, Rh, Pd, Re, OSirPt, U, Co, Fe, Ni, Mn, Cr, Cu, Mg, V, Nb, Ta, Mo and W, or being a film containing a bismuth layered-structure ferroelectric crystal having a structure in which a bismuth oxide layer and a perovskite-type structure block are stacked alternately, the perovskite-type structure block being composed of at least one element L selected from Li, Na, K, Ca, Sr, Ba, Y, Bi, Pb and a rare earth element, at least one element R selected from Ti, Zr, Hf, V, Nb, Ta, W, Mo, Mn, Fe, Si and Ge, and oxygen.

Meanwhile, the dielectric film is, for example, a PZT film.

[7] The crystal film according to the above [6], wherein said dielectric film is oriented in (001).

[8] The crystal film according to the above [5], wherein:
on the Pt film, a PZT film oriented in (001) is formed; and
a peak half-value width when the PZT film is evaluated by X-ray diffraction is 0.05° to 2.0° (preferably 0.05° to 0.5°).

[9] A method for manufacturing a crystal film, including the steps of:
forming a Zr film on a substrate heated to 700° C. or more by a vapor deposition method using a vapor deposition material having Zr; and
forming a stacked film in which a $ZrO_2$ film and a $Y_2O_3$ film are stacked or a YSZ film on the Zr film on a substrate heated to 700° C. or more, by a vapor deposition method using the vapor deposition material having Zr, a vapor deposition material having Y, and oxygen.

[10] The method for manufacturing a crystal film according to the above [9], wherein:
said substrate has a (100) crystal plane; and
said stacked film or said YSZ film is oriented in (100).

[11] The method for manufacturing a crystal film according to the above [9] or [10], wherein a peak half-value width when the stacked film or the YSZ film is evaluated by X-ray diffraction is 0.05° to 2.0° (preferably 0.05° to 0.5°).

[12] The method for manufacturing a crystal film according to any one of the above [9] to [11], wherein:
on the stacked film or the YSZ film, an electroconductive film oriented in (100) is formed; and
on the electroconductive film, a dielectric film oriented in (001) is formed.

[13] The method for manufacturing a crystal film according to the above [12], wherein:
the electroconductive film is a film containing a metal; and
said dielectric film is represented by a general formula $ABO_3$, being a film containing a perovskite material, A including at least one element selected from the group consisting of Al, Y, Na, K, Rb, Cs, La, Sr, Cr, Ag, Ca, Pr, Nd, Bi and an element of the lanthanum series in the periodic table, B including at least one element selected from the group consisting of Al, Ga, In, Nb, Sn, Ti, Ru, Rh, Pd, Re, OSirPt, U, Co, Fe, Ni, Mn, Cr, Cu, Mg, V, Nb, Ta, Mo and W, or being a film containing a bismuth layered-structure ferroelectric crystal having a structure in which a bismuth oxide layer and a perovskite-type structure block are stacked alternately, said perovskite-type structure block being composed of at least one element L selected from Li, Na, K, Ca, Sr, Ba, Y, Bi, Pb and a rare earth element, at least one element R selected from Ti, Zr, Hf, V, Nb, Ta, W, Mo, Mn, Fe, Si and Ge, and oxygen.

[14] The method for manufacturing a crystal film according to the above [12], wherein:

the electroconductive film is a Pt film; and a peak half-value width when the Pt film is evaluated by X-ray diffraction is 0.05° to 2.0° (preferably 0.05° to 0.5°).

[15] The method for manufacturing a crystal film according to the above [12] or [14], wherein:

the dielectric film is a PZT film; and a peak half-value width when the PZT film is evaluated by X-ray diffraction is from 0.05° to 2.0° (preferably 0.05° to 0.5°).

[16] The method for manufacturing a crystal film according to any one of the above [9] to [15], wherein said vapor deposition material having Zr is a vapor deposition material having a Zr single crystal.

[17] A vapor deposition apparatus, including:

a first chamber;

a substrate holder holding a substrate, disposed in the first chamber;

a vapor deposition material having Zr and a vapor deposition material having Y;

a first heating mechanism heating the vapor deposition material;

a gas-supplying mechanism supplying oxygen gas into the first chamber; and an evacuating mechanism evacuating the inside of the first chamber.

[18] The vapor deposition apparatus according to the above [17], wherein:

heating and evaporation of said Zr by said first heating mechanism allows forming a Zr film on said substrate; and heating and evaporation of said vapor deposition materials by said first heating mechanism, and supply of said oxygen gas by said gas-supplying mechanism allow forming a stacked film in which a $ZrO_2$ film and a $Y_2O_3$ film are stacked or a YSZ film on said Zr film.

[19] The vapor deposition apparatus according to the above [17] or [18], wherein:

said apparatus has a second heating mechanism heating the substrate; and when heating and evaporating said vapor deposition material, said second heating mechanism heats said substrate to give a temperature of 700° C. or more.

[20] The vapor deposition apparatus according to any one of the above [17] to [19], wherein said first heating mechanism is a mechanism that heats said vapor deposition material by an electron beam.

[21] The vapor deposition apparatus according to any one of the above [17] to [20], wherein said vapor deposition material having Zr and the vapor deposition material having Y are a vapor deposition material having a Zr single crystal and a vapor deposition material having Y.

[22] A multi-chamber apparatus comprising:

said vapor deposition apparatus according to any one of the above [17] to [21];

a transfer room connected to said first chamber via a first gate valve;

a transfer mechanism transferring said substrate, disposed in said transfer room;

a second chamber connected to said transfer room via a second gate valve;

a first sputtering device forming an electroconductive film on said stacked film or said YSZ film in said second chamber;

a third chamber connected to said transfer room via a third gate valve; and a film-forming apparatus forming a dielectric film on said electroconductive film in said third chamber.

[23] The multi-chamber apparatus according to the above [22], wherein said film-forming apparatus is an apparatus that forms a dielectric film by coating a sol-gel solution by spin-coating.

[24] The multi-chamber apparatus according to the above [22], wherein said film-forming apparatus is a second sputtering device that forms said dielectric film by a sputtering method.

Effect of the Invention

According to an aspect of the present invention, the single crystallinity of a stacked film in which a $ZrO_2$ film and a $Y_2O_3$ film are stacked or a YSZ film can be enhanced.

Furthermore, according to an aspect of the present invention, there can be provided a vapor deposition apparatus or a multi-chamber apparatus capable of manufacturing a stacked film in which a $ZrO_2$ film and a $Y_2O_3$ film are stacked or a YSZ film, having improved single crystallinity.

DESCRIPTION OF THE PREFERRED EMBODIMENTS

Hereinafter, embodiments and an example of the present invention will be explained in detail using the drawings. However, a person skilled in the art would easily understand that the present invention is not limited to the explanation below, but that modes and details thereof can be changed in various ways without departing from the purport and the scope of the present invention. Accordingly, the present invention should not be construed as being limited to the description of the present embodiments and the example shown below.

First Embodiment

<<Manufacturing Apparatus>>

Figure 1:
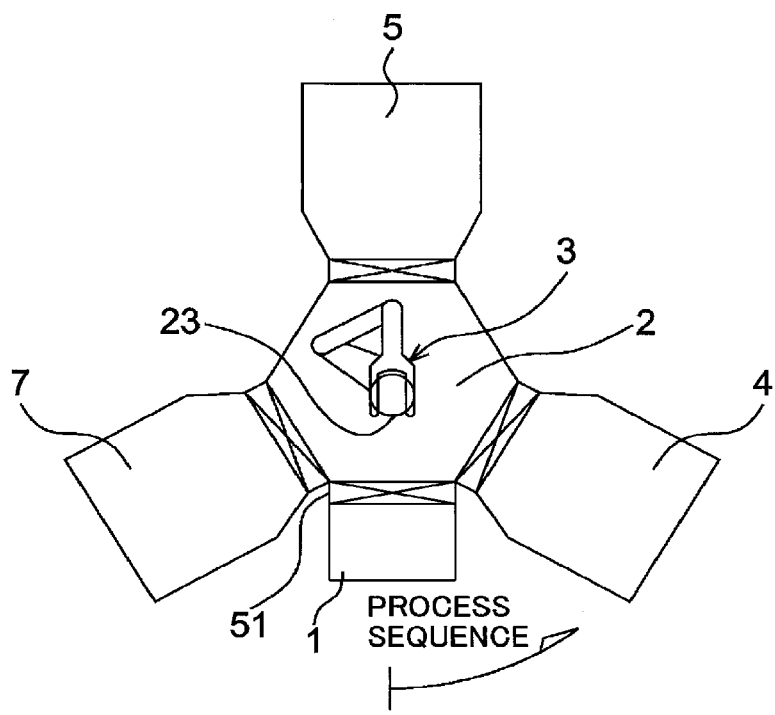
FIG. 1 is a plan view schematically showing the multi-chamber apparatus according to an aspect of the present invention.
Figure 2:
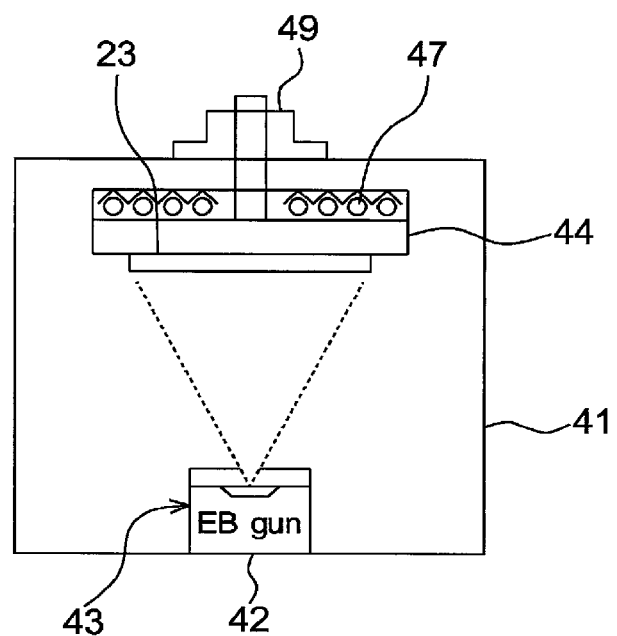
FIG. 2 is a cross-sectional view schematically showing a vapor deposition apparatus having a first chamber shown in FIG. 1.

FIG. 1 is a plan view schematically showing the multi-chamber apparatus according to an aspect of the present invention. FIG. 2 is a cross-sectional view schematically showing a vapor deposition apparatus having a first chamber shown in FIG. 1.

The multi-chamber apparatus has a load lock room 1, a transfer room 2, a transfer robot 3, a vapor deposition room 4, a Pt sputtering room 5, and a PZT sputtering room 7.

A vacuum pump (not shown) is connected to the load lock room 1, and it is configured such that a substrate (for example, Si substrate or Si wafer) to be subjected to a film-forming treatment is introduced into the load lock room 1 and the inside of the load lock room 1 is evacuated by the vacuum pump.

The transfer room 2 is connected to the load lock room 1 via a gate valve 51. In the transfer room 2, the transfer robot 3 is disposed. A vacuum pump (not shown) is connected to the transfer room 2, and it is configured such that the inside of the transfer room 2 is evacuated by the vacuum pump.

The vapor deposition room 4 is for forming a Zr film on a Si wafer (also referred to as a Si substrate) 23, and on the Zr film, forming a stacked film in which a $ZrO_2$ film and a $Y_2O_3$ film are stacked or a YSZ film by a vapor deposition method, and is connected to the transfer room 2 via the gate valve 51. The vapor deposition room 4 has a first chamber, and the multi-chamber apparatus has a vapor deposition apparatus having the first chamber (see FIG. 2). It is configured such that the Si wafer 23 is transferred from the inside of the load lock room 1 to the first chamber of the vapor deposition room 4 through the transfer room 2 by the transfer robot 3. The vapor deposition apparatus shown in FIG. 2 will be described later.

Meanwhile, in the specification, the "YSZ film" denotes a film that is composed of a mixture of $Y_2O_3$ and $ZrO_2$ formed by the oxidization of Y and Zr by oxygen and that is in a stable state, but it also includes a film of a mixture of $Y_2O_3$ and $ZrO_2$ obtained by thermal diffusion of a stacked film in which a $ZrO_2$ film and a $Y_2O_3$ film are stacked. In a wide sense, a widely known substance of $ZrO_2$ with which several % of $Y_2O_3$ is mixed (for stabilizing the oxidation number of Zr) is a substance to which $Y_2O_3$ is added by 8%, or a widely known substance obtained by oxidizing an alloy of Zr and Y added by several % is a substance obtained by oxidizing an alloy of Zr and Y added by 8%.

The Pt sputtering room 5 is for forming a Pt film on the Si wafer 23 by sputtering, and is connected to the transfer room 2 via the gate valve 51. The sputtering room 5 has a first sputtering device (not shown) having a second chamber. It is configured such that the Si wafer 23 is transferred from the inside of the first chamber of the vapor deposition room 4 to the inside of the second chamber of the sputtering room 5 through the transfer room 2, by the transfer robot 3.

The PZT sputtering room 7 is for forming a PZT film on the Si wafer 23 by sputtering, and is connected to the transfer room 2 via the gate valve 51. The PZT sputtering room 7 has a second sputtering device (not shown) having a third chamber. It is configured such that the Si wafer 23 is transferred from the inside of the second chamber of the sputtering room 5 to the inside of the third chamber of the sputtering room 7 through the transfer room 2, by the transfer robot 3. Meanwhile, a sputtering device for forming a PZT film is used in the third chamber of the PZT sputtering room 7, but a sputtering device for forming a dielectric film other than PZT may be used in the third chamber.

The vapor deposition apparatus shown in FIG. 2 is an EB-type vapor deposition apparatus. The EB-type vapor deposition apparatus has a first chamber 41, and a vapor deposition source 43 is disposed in a lower part of the first chamber 41. A substrate holder 44 is disposed in the upper part of the first chamber 41, and the substrate holder 44 is disposed so as to face the vapor deposition source 43. The vapor deposition source 43 has a crucible storing a vapor deposition material of a Zr single crystal, a crucible storing a vapor deposition material containing Y, and an electron gun (EB gun) 42. A cooling mechanism (not shown) is attached to the crucible. The vapor deposition source 43 is a source for evaporating the vapor deposition material by irradiating the vapor deposition material with electron beams from the electron gun 42 to heat the material.

The substrate holder 44 is for holding the Si substrate 23, and is mounted to a rotation mechanism 49. It is configured such that the substrate holder 44 can be rotated by the rotation mechanism 49. In addition, on a side face of the upper part of the substrate holder 44 (a side face opposite to the placing part of the Si substrate 23), a heating heater (infrared lamp) 47 for heating the substrate is disposed. On the lower face of the substrate holder 44 (mounting face for the substrate), a reflection plate (not shown) is disposed. Furthermore, the substrate holder 44 includes a substrate cooling mechanism (not shown) for lowering substrate temperature.

A reactant gas-supplying mechanism (not shown) supplying a reactant gas is connected to the first chamber 41. The reactant gas is, for example, oxygen gas ($O_2$). Moreover, a vacuum pump system (not shown) for lowering the internal pressure of the first chamber 41 to a prescribed pressure is connected to the first chamber 41.

Meanwhile, in the present embodiment, the EB-type vapor deposition apparatus shown in FIG. 2 is used as a vapor deposition apparatus having the first chamber shown in FIG. 1, but another vapor deposition apparatus may be used, for example, a boat-type vapor deposition apparatus or an RF-type ion plating apparatus may be used.

The boat type vapor deposition apparatus or the RF-type ion plating apparatus has a vapor deposition source provided with a vapor deposition material of a Zr single crystal and a vapor deposition material containing Y, respectively, and is an apparatus that forms, on a substrate, an oxide by reacting evaporated materials obtained by evaporating these vapor deposition materials, with oxygen.

<<Method for Manufacturing Crystal Film>>

Figure 3:
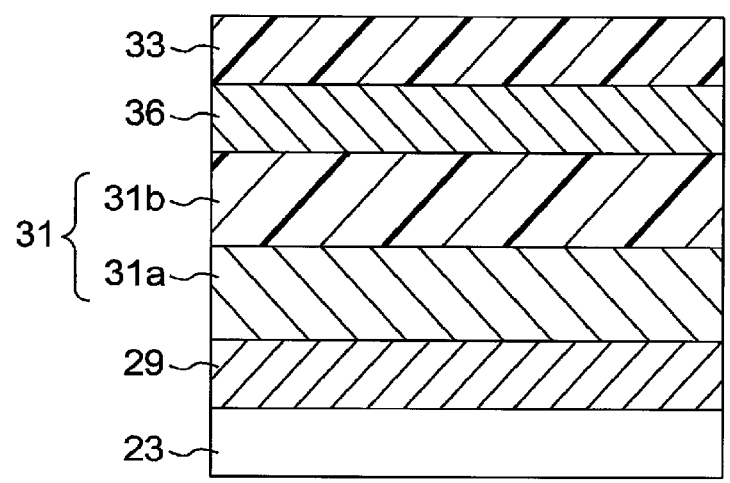
FIG. 3 is a cross-sectional view for explaining the method for manufacturing a crystal film according to an aspect of the present invention.

FIG. 3 is a cross-sectional view for explaining the method for manufacturing a crystal film according to an aspect of the present invention. The crystal film is produced using the multi-chamber apparatus shown in FIG. 1 and the EB type vapor deposition apparatus shown in FIG. 2.

The Si substrate 23 having a (100) crystal plane is prepared, the Si substrate 23 is introduced into the first chamber 41 of the vapor deposition room 4, and the Si substrate 23 is held by the substrate holder 44. On the (100) crystal plane of the Si substrate 23, an oxide film such as an $SiO_2$ film or a $TiO_2$ film may have been formed. Next, the Si substrate 23 is rotated together with the substrate holder 44 by the rotation mechanism 49, and by performing evacuation by the vacuum pump system, the internal pressure of the first chamber 41 reaches a prescribed pressure. Subsequently, the heating heater 47 is switched on to thereby irradiate the rear face of the Si substrate 23 with the lamp light and to thereby heat the Si substrate 23 to 700° C. or more (preferably to 800° C. or more). Meanwhile, in the present embodiment, the substrate temperature is raised, for example, up to 800° C. and the Si substrate 23 is maintained at the temperature.

Next, the vapor deposition material of the Zr single crystal is irradiated with electron beams by the electron gun 42 and is heated, and by evaporating the Zr single crystal, a Zr film 29 is formed for a prescribed time period on the (100) crystal plane of the Si substrate 23. The thickness of the Zr film 29 may be 0.2 nm to 30 nm, and is preferably 0.2 nm to 5 nm. Meanwhile, in the present embodiment, the thickness of the Zr film 29 is 0.5 nm.

Subsequently, oxygen gas is introduced into the first chamber 41 by the reactant gas-supplying mechanism. Consequently, the material of the evaporated Zr single crystal reacts with the oxygen on the Zr film on the Si substrate 23 heated to 700° C. or more to thereby be formed as a $ZrO_2$ film 31a.

Then, the vapor deposition material of Y is irradiated with electron beams by the electron gun 42 and is heated, and by evaporating Y, the material of evaporated Y reacts with oxygen on the $ZrO_2$ film on the Si substrate 23 heated to 700° C. or more to thereby be formed as a $Y_2O_3$ film 31b (see FIG. 3). In this way, a stacked film 31, in which the $ZrO_2$ film 31a and the $Y_2O_3$ film 31b are stacked, is formed, and the stacked film 31 is oriented in (100) in the same way as the (100) crystal plane of the Si substrate 23. The stacked film 31 may have a thickness of 2 nm to 100 nm (preferably 10 nm to 50 nm), and the peak half-value width when evaluating the film by X-ray diffraction is 0.05° to 2.0° (preferably 0.05° to 0.5°), which shows that the film has extremely high single crystallinity. Meanwhile, in the present embodiment, the thickness of the $ZrO_2$ film 31a is 15 nm, and the thickness of the $Y_2O_3$ film 31b is 15 nm.

Meanwhile, in the present embodiment, the stacked film 31 is formed on the Si substrate 23, but the embodiment is not limited to the stacked film 31, and a (100) oriented film other than the stacked film may be formed on the Si substrate 23. The (100) oriented film referred herein means a film that is oriented in (100) in the same way as the (100) crystal plane of the Si substrate 23.

Furthermore, in the present embodiment, the stacked film 31 is formed on the Si substrate 23, but instead of the stacked film 31, a YSZ film may be formed. At this time, the vapor deposition material of a Zr single crystal is irradiated with electron beams by the electron gun 42 and is heated, and by evaporating the Zr single crystal, the Zr film is formed for a prescribed time period on the (100) crystal plane of the Si substrate 23. After that, the Zr single crystal and the vapor deposition material of Y are irradiated with electron beams from the electron gun 42 and are heated, and, by evaporating the Zr single crystal and Y, materials obtained by the evaporation of the Zr single crystal and Y react with oxygen on the Si substrate 23 heated to 700° C. or more to thereby form an oxide. Thus, the YSZ film is deposited on the Zr film. The YSZ film is oriented in (100) in the same way as the (100) crystal plane of the Si substrate 23. The YSZ film has a peak half-value width of 0.05° to 2.0° (preferably 0.05° to 0.5°) when the film is evaluated by X-ray diffraction, and is a film with extremely high single crystallinity. In addition, the thickness of the YSZ film may be 2 nm to 100 nm (preferably 10 nm to 50 nm).

Next, the Si wafer 23 is transferred from the inside of the first chamber of the vapor deposition room 4 to the inside of the second chamber of the sputtering room 5 through the transfer room 2, by the transfer robot 3 (see FIG. 1).

Subsequently, a Pt film 36 based on epitaxial growth is formed on the stacked film 31 by sputtering in the second chamber. The Pt film 36 is oriented in (100) in the same way as the stacked film 31. The peak half-value width when the Pt film 36 is evaluated by X-ray diffraction may be 0.05° to 2.0° (preferably 0.05° to 0.5°). The Pt film 36 may preferably function as an electrode. Meanwhile, the Pt film 36 may be an electroconductive film other than Pt.

Then, the Si wafer 23 is transferred from the inside of the second chamber of the sputtering room 5 to the inside of the third chamber of the PZT sputtering room 7 through the transfer room 2 by the transfer robot 3 (see FIG. 1).

Next, a PZT film 33 based on epitaxial growth is formed on the Pt film 36 by sputtering in the third chamber. The PZT film 33 is oriented in (001). The peak half-value width when the PZT film 33 is evaluated by X-ray diffraction may be 0.05° to 2.0° (preferably 0.05° to 0.5°).

Meanwhile, in the present embodiment, the PZT film 33 is formed on the Pt film 36, but the embodiment is not limited to the PZT film. A dielectric film oriented in (001) other than the PZT film 33 may be formed on the Pt film 36. The dielectric film may be represented by a general formula $ABO_3$, being a film containing a perovskite material, A including at least one element selected from the group consisting of Al, Y, Na, K, Rb, Cs, La, Sr, Cr, Ag, Ca, Pr, Nd, Bi and an element of the lanthanum series in the periodic table, B including at least one element selected from the group consisting of Al, Ga, In, Nb, Sn, Ti, Ru, Rh, Pd, Re, OSirPt, U, Co, Fe, Ni, Mn, Cr, Cu, Mg, V, Nb, Ta, Mo and W, or being a film containing a bismuth layered-structure ferroelectric crystal having a structure in which a bismuth oxide layer and a perovskite-type structure block are stacked alternately, the perovskite-type structure block being composed of at least one element L selected from Li, Na, K, Ca, Sr, Ba, Y, Bi, Pb and a rare earth element, at least one element R selected from Ti, Zr, Hf, V, Nb, Ta, W, Mo, Mn, Fe, Si and Ge, and oxygen.

According to the present embodiment, since the Zr film 29 is formed on the Si substrate by the vapor deposition method using the vapor deposition material of a Zr single crystal, the single crystallinity of the stacked film 31 in which the $ZrO_2$ film 31a and the $Y_2O_3$ film 31b are stacked (or the YSZ film), formed on the Zr film 29 can be made extremely high. That is, the single crystallinity of the stacked film 31 (or the YSZ film) can be made extremely higher than the case where polycrystalline or amorphous Zr is used as the vapor deposition material.

Furthermore, since the stacked film 31 (or the YSZ film) with extremely high single crystallinity and having a half-value width of 0.05° to 2.0° (preferably 0.05° to 0.5°) is formed under the Pt film 36, the crystallinity of the Pt film 36 can be improved. Consequently, the peak half-value width when the Pt film is evaluated by X-ray diffraction can be in the range of 0.05° to 2.0° (preferably 0.05° to 0.5°).

Moreover, since the Pt film 36 with extremely high single crystallinity and having a half-value width of 0.05° to 2.0° (preferably 0.05° to 0.5°) is formed under the PZT film 33, the crystallinity of the PZT film 33 can be improved. Consequently, the peak half-value width when the PZT film 33 is evaluated by X-ray diffraction can be in the range of 0.05° to 2.0° (preferably 0.05° to 0.5°).

Second Embodiment

<<Manufacturing Apparatus>>

In the multi-chamber apparatus according to the present embodiment, the second sputtering device of the PZT sputtering room 7 shown in FIG. 1 is changed to a sol-gel spin coating-type PZT-forming apparatus (also referred to as a dielectric film-forming apparatus), and the other points are the same as those of the multi-chamber apparatus shown in FIG. 1. The sol-gel spin coating-type PZT-forming apparatus has a fourth chamber, and the fourth chamber is connected to the transfer room 2 via the gate valve 51.

It is configured such that the Si wafer 23 is transferred from the inside of the second chamber of the sputtering room 5 to the inside of the fourth chamber of the sol-gel spin coating-type PZT-forming apparatus through the transfer room 2 by the transfer robot 3.

The sol-gel spin coating-type PZT-forming apparatus is an apparatus that coats a sol-gel solution on the Si wafer 23 by spin coating to thereby form a PZT film.

<<Method for Manufacturing Crystal Film>>

Only the point that is different from that for the substrate shown in FIG. 3 will be explained.

By the same method as that for the substrate shown in FIG. 3, the stacked film 31 in which the $ZrO_2$ film and the $Y_2O_3$ film are stacked (or YSZ film) is formed on the Si substrate 23, and the Pt film 36 is formed on the stacked film 31.

Next, the Si wafer 23 is transferred from the inside of the second chamber of the sputtering room 5 to the inside of the fourth chamber of the sol-gel spin coating type PZT-forming apparatus through the transfer room 2, by the transfer robot 3.

Next, a sol-gel solution is coated onto the Pt film 36 by spin coating to form the PZT film. After that, the PZT film is subjected to a drying treatment, temporary calcination and a crystallization treatment. Since the crystallization treatment is performed at a temperature of 500° C. or more, the stacked film 31 has preferably heat-resistance up to 500° C. or more. The PZT film is oriented in (001) in the same way as the PZT film 33 shown in FIG. 3. Meanwhile, in the present embodiment, the PZT film is formed on the Pt film 36, but the embodiment is not limited to the PZT film, and a dielectric film other than the PZT film may be formed on the Pt film 36. As the dielectric film, the same dielectric film as that in the first embodiment can be used.

The effect same as that in the first embodiment can also be obtained in the present embodiment.

Furthermore, in the present embodiment, since the stacked film 31 (or YSZ film) with extremely high single crystallinity having a half-value width of 0.05° to 2.0° (preferably 0.05° to 0.5°) is formed under the PZT film formed by the sol-gel spin coating-type PZT-forming apparatus, the crystallinity of the PZT film can be improved. Therefore, the peak half-value width when the PZT film 33 is evaluated by X-ray diffraction can be in the range of 0.05° to 2.0° (preferably 0.05° to 0.5°).

Meanwhile, the above-described embodiments may be combined appropriately and practiced.

EXAMPLE

Through the use of an EB type vapor deposition apparatus shown in FIG. 2, a Zr film was formed on a 6-inch Si wafer, a $ZrO_2$ film was formed on the Zr film, and a $Y_2O_3$ film was formed on the $ZrO_2$ film. That is, a stacked film (hereinafter, referred to as a "YSZ film") in which the $ZrO_2$ film and the $Y_2O_3$ film were stacked was formed on the Zr film. The film-forming conditions are as shown in Table 1.

TABLE 1

| Sample No. | Zr(Metal) | $ZrO_2$ + $Y_2O_3$ | |
|---|---|---|---|
| ULTIMATE VACUUM DEGREE | 2.00E−04 | 8.70E−05 | |
| VACUUM DEGREE IN FILM FORMING | 750E−04 | 9.50E−03 | 9.20E−03 |
| VAPOR DEPOSITION | Zr | Zr | Y |

TABLE 1-continued

| Sample No. | Zr(Metal) | $ZrO_2$ + $Y_2O_3$ | |
|---|---|---|---|
| SOURCE | | | |
| EB VOLTAGE/ | 7.5 kV/ | 7.5 kV/ | 7.5 kV/ |
| Emission | 1.3 mA | 1.3 mA | 0.4 mA |
| FILM FORMING TEMPERATURE | 850° C. | 850° C. | 850° C. |
| INTENDED FILM THICKNESS | 0.5 nm | 15 nm | 15 nm |
| $O_2$ FLOW RATE | Not APPLICABLE | 5 sccm | 5 sccm |

Figure 4:
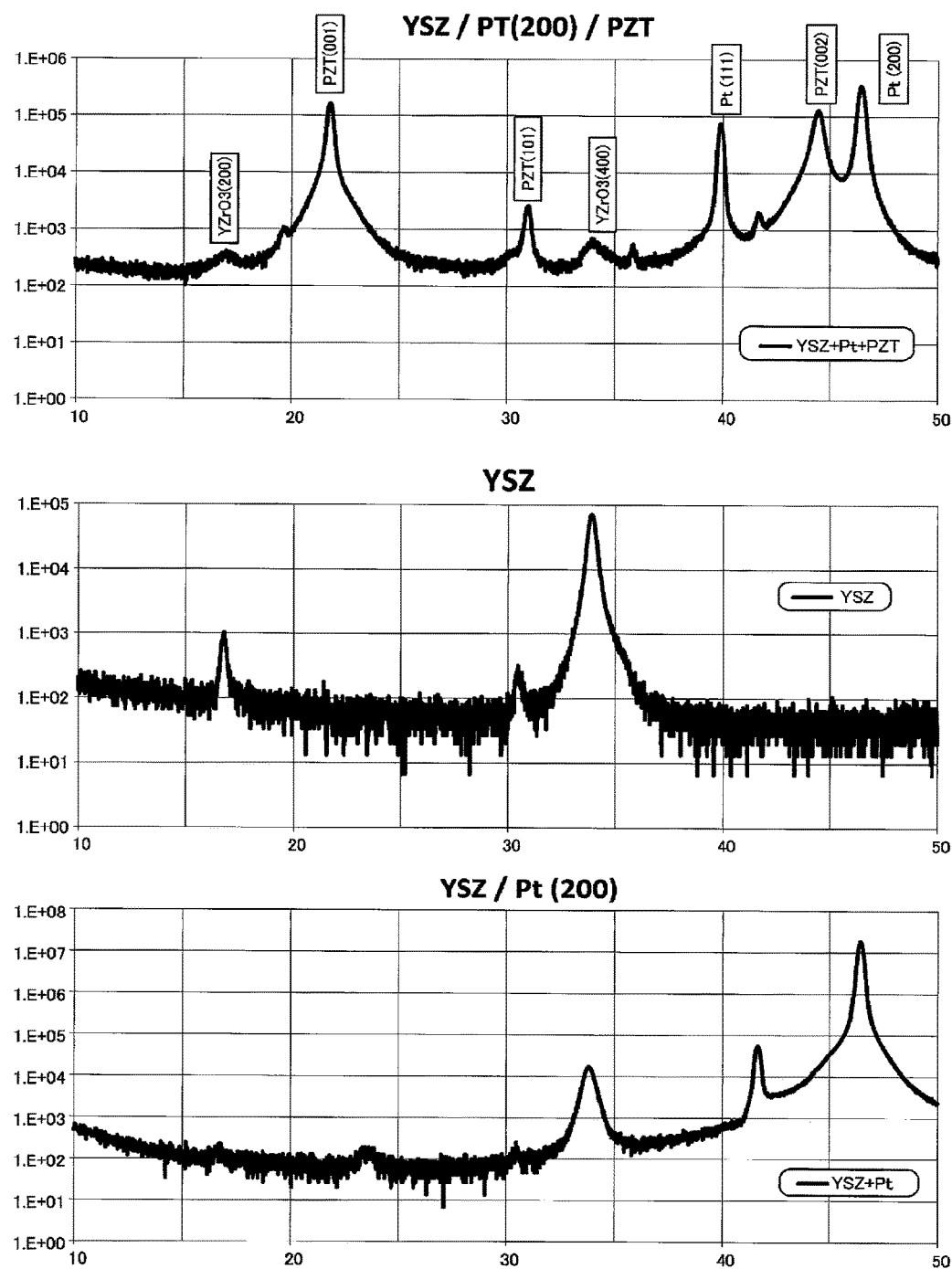
FIG. 4 is a drawing showing results of evaluating crystallinity of the PZT film, the YSZ film and the Pt film in Example by XRD.

The result of evaluating the crystallinity of the YSZ film by XRD is shown in FIG. 4.

As shown in FIG. 4, the YSZ film (in FIG. 4, described as $YZrO_3$) has a peak half-value width of 0.37°, and is found to be a crystal film with extremely high single crystallinity. Furthermore, the YSZ film is an oriented film oriented in (200) and (400), but the orientation in (200) and (400) is equivalent to the orientation in (100).

In contrast to this, in Patent Literature 1, it is described that the half-value width is 7° as the result of forming a YSZ film by a vapor deposition method using polycrystalline Zr and evaluating the crystallinity of the YSZ film.

Accordingly, it is found that, by forming a YSZ film by a vapor deposition method using a vapor deposition material of a Zr single crystal, the single crystallinity of the YSZ film can be made extremely higher as compared with the case of using a vapor deposition material of polycrystalline Zr.

Subsequently, a Pt film is formed on the YSZ film by sputtering using the sputtering room 5 shown in FIG. 1. Conditions in the film-forming are as follows.

Pressure in film-forming: 5 Pa
Gas (argon) flow rate: 5 sccm
RF output: 30 W
Film-forming time: 11 min (in film-forming of 150 nm)

The result of evaluating the crystallinity of the Pt film by XRD is shown in FIG. 4.

As shown in FIG. 4, the Pt film has a peak half-value width of 0.29°, and is found to be a crystal film with extremely high single crystallinity. In addition, the Pt film is an oriented film oriented in (200), and the orientation in (200) is equivalent to the orientation in (100).

Subsequently, a PZT film is formed on the Pt film. Detailed explanation will be given below.

[Spin Coating]

Through the use of the sol-gel spin coating-type PZT-film forming apparatus according to the second embodiment, spin coating was performed using a Pb 30%-excessive sol-gel PZT solution (Pb/Zr/Ti=130/55/45). Consequently, a PZT thin film was produced on a 6-inch wafer. The coating of the PZT film was performed while setting the coating amount per one layer to be 5 cc and using spin conditions as follows.

<Spin Conditions>

From 0 to 50 rpm, rise in the rotation number in 30 seconds under SLOPE control while performing lamp irradiation;

From 50 to 500 rpm, rise in the rotation number in 10 seconds under SLOPE control;

From 500 to 2000 rpm, rise in the rotation number in 10 seconds under SLOPE control (with back rinse coating);

At 2000 rpm, held for 5 seconds;

Raised to 4500 rpm, and held for 7 seconds; and

Raised up to 7500 rpm, and held for 5 seconds.

Meanwhile, the SLOPE control denotes control of raising the rotation number in a stepwise manner, and means including control of stepwise rise in the rotation number and control of continuous rise in the rotation number.

[Drying and Pressurized Temporary Calcination]

For every coating, a drying process was performed for the purpose of removing an alcohol component. The drying was performed while holding a sample for 90 seconds on a hot plate heated to 200° C. Subsequently, a pressurized temporary calcination process was performed for the purpose of decomposing and removing organic components. First, evacuation to $10^{-3}$ Pa was performed with a rotary pump. After that, oxygen gas was introduced up to 9.8 atmospheric pressures, and pressurizing and heating treatments were performed at 450° C. for 150 seconds.

[Pressurized RTA (Rapid Thermal Anneal)]

Through the use of a first pressurizing-type lamp annealing device, a pressurized RTA treatment of 9.8 atmospheric pressures at 650° C. for 400 seconds was performed for accelerating the oxidation and crystallization of the PZT film.

The above-described process of coating, drying, pressurized temporary calcination and pressurized RTA was repeated 5 times.

In this way, the PZT film having a total thickness of 1 μm was produced.

The result of evaluating the crystallinity of the PZT film by XRD is shown in FIG. 4.

As shown in FIG. 4, the PZT film has a peak half-value width of 0.33°, and is found to be a crystal film with extremely high single crystallinity. In addition, the PZT film is an oriented film oriented in (001).

DESCRIPTION OF REFERENCE SYMBOLS 1 load lock room
2 transfer room
3 transfer robot
4 vapor deposition room
5 Pt sputtering room
7 PZT sputtering room
23 Si wafer (Si substrate)
29 Zr film
31 stacked film in which the $ZrO_2$ film 31a and the $Y_2O_3$ film 31b are stacked
31a $ZrO_2$ film
31b $Y_2O_3$ film
33 PZT film
36 Pt film
41 first chamber
42 electron gun (EB gun)
43 vapor deposition source
44 substrate holder
47 heating heater (infrared lamp)
49 rotation mechanism
51 gate valve

The invention claimed is:

1. A method for manufacturing a crystal film, comprising the steps of:
   forming a Zr film on a substrate heated to 700° C. or more by a vapor deposition method using a vapor deposition material having a Zr single crystal;
   forming a $ZrO_2$ film on said Zr film on a substrate heated to 700° C. or more, by a vapor deposition method using said vapor deposition material having a Zr single crystal, and oxygen; and
   forming a $Y_2O_3$ film on said $ZrO_2$ film on a substrate heated to 700° C. or more, by a vapor deposition method using a vapor deposition material having Y, and oxygen.

2. The method for manufacturing a crystal film according to claim 1, wherein:
   said substrate has a (100) crystal plane; and
   a stacked film in which said $ZrO_2$ film and said $Y_2O_3$ film are stacked is oriented in (100).

3. The method for manufacturing a crystal film according to claim 1, wherein a peak half-value width when a stacked film in which said $ZrO_2$ film and said $Y_2O_3$ film are stacked is evaluated by X-ray diffraction is 0.05° to 2.0°.

4. The method for manufacturing a crystal film according to claim 1, wherein:
   on a stacked film in which said $ZrO_2$ film and said $Y_2O_3$ film are stacked, an electroconductive film oriented in (100) is formed; and
   on said electroconductive film, a dielectric film oriented in (001) is formed.

5. The method for manufacturing a crystal film according to claim 4, wherein:
   said electroconductive film is a film containing a metal; and
   said dielectric film is represented by a general formula $ABO_3$, being a film containing a perovskite material, A including at least one element selected from the group consisting of Al, Y, Na, K, Rb, Cs, La, Sr, Cr, Ag, Ca, Pr, Nd, Bi and an element of the lanthanum series in the periodic table, B including at least one element selected from the group consisting of Al, Ga, In, Nb, Sn, Ti, Ru, Rh, Pd, Re, OSirPt, U, Co, Fe, Ni, Mn, Cr, Cu, Mg, V, Nb, Ta, Mo and W, or being a film containing a bismuth layered-structure ferroelectric crystal having a structure in which a bismuth oxide layer and a perovskite-type structure block are stacked alternately, said perovskite-type structure block being composed of at least one element L selected from Li, Na, K, Ca, Sr, Ba, Y, Bi, Pb and a rare earth element, at least one element R selected from Ti, Zr, Hf, V, Nb, Ta, W, Mo, Mn, Fe, Si and Ge, and oxygen.

6. The method for manufacturing a crystal film according to claim 4, wherein:
   said electroconductive film is a Pt film; and
   a peak half-value width when said Pt film is evaluated by X-ray diffraction is 0.05° to 2.0°.

7. The method for manufacturing a crystal film according to claim 4, wherein:
   said dielectric film is a PZT film; and
   a peak half-value width when said PZT film is evaluated by X-ray diffraction is 0.05° to 2.0°.

8. The method for manufacturing a crystal film according to claim 1, wherein the step of forming the Zr film on the substrate comprises setting an atmosphere around the substrate to a prescribed pressure by performing evacuation by the vacuum pump system, heating the substrate to 700° C. or more, and forming the Zr film on the substrate by heating and evaporating the vapor deposition material having the Zr single crystal.

* * * * *